United States Patent
Hayashi

(10) Patent No.: US 9,531,263 B2
(45) Date of Patent: Dec. 27, 2016

(54) SEMICONDUCTOR DEVICE

(71) Applicant: Kabushiki Kaisha Toshiba, Minato-ku, Tokyo (JP)

(72) Inventor: Ryosuke Hayashi, Fuchu Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/845,392

(22) Filed: Sep. 4, 2015

(65) Prior Publication Data

US 2016/0268894 A1 Sep. 15, 2016

(30) Foreign Application Priority Data

Mar. 9, 2015 (JP) ................................. 2015-046179

(51) Int. Cl.
*H03K 17/08* (2006.01)
*H02M 3/10* (2006.01)

(52) U.S. Cl.
CPC ..................................... *H02M 3/10* (2013.01)

(58) Field of Classification Search
CPC ........ H02M 3/10; H03G 11/02; H03K 17/081; H03K 17/08104; H03K 17/0812
See application file for complete search history.

(56) References Cited

U.S. PATENT DOCUMENTS

| | | | | |
|---|---|---|---|---|
| 5,963,407 A | * | 10/1999 | Fragapane | H03K 17/0828 361/115 |
| 6,087,877 A | | 7/2000 | Gonda et al. | |
| 6,614,633 B1 | * | 9/2003 | Kohno | H01L 27/0266 361/111 |
| 6,700,428 B2 | * | 3/2004 | Sander | H03K 17/0822 327/312 |
| 7,365,584 B2 | * | 4/2008 | Bennett | H03K 17/0822 327/110 |
| 8,587,362 B2 | | 11/2013 | Machida et al. | |
| 8,710,894 B2 | * | 4/2014 | Arndt | H01L 23/62 327/309 |

FOREIGN PATENT DOCUMENTS

| | | |
|---|---|---|
| JP | 2014-138303 | 7/2014 |
| JP | 2014-138476 | 7/2014 |

* cited by examiner

*Primary Examiner* — Jeffrey Zweizig
(74) *Attorney, Agent, or Firm* — White & Case LLP

(57) ABSTRACT

A semiconductor device according to an embodiment comprises a first transistor capable of supplying or interrupting power to a load. A clamper comprises a first clamping part and a second clamping part connected in series between one end of the first transistor and a gate of the first transistor and becomes a conduction state when a voltage of the one end of the first transistor exceeds a predetermined voltage. A clamp operation detector is provided between the first clamping part and the second clamping part. A second transistor is connected in parallel with the second clamping part. A delay circuit is provided between the clamp operation detector and a gate of the second transistor.

17 Claims, 3 Drawing Sheets

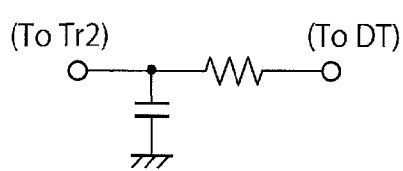 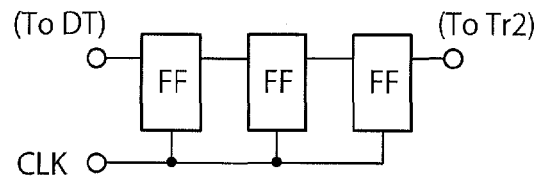
FIG. 3A   FIG. 3B
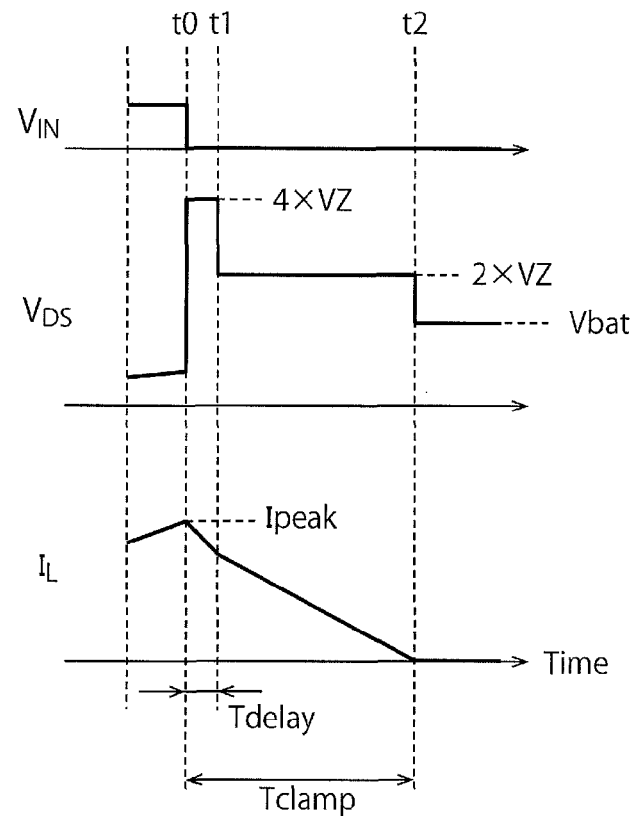
FIG. 4

SEMICONDUCTOR DEVICE

CROSS REFERENCE TO RELATED APPLICATIONS

This application is based upon and claims the benefit of priority from the prior Japanese Patent Application No. 2015-046179, filed on Mar. 9, 2015, the entire contents of which are incorporated herein by reference.

FIELD

The embodiments of the present invention relate to a semiconductor device.

BACKGROUND

A clamp circuit is conventionally provided to protect a switch from induced electromotive force produced by a load (an inductor). In recent years, a MOSFET (Metal Oxide Semiconductor Field Effect Transistor) used as a switch is more and more downscaled and a secondary breakdown voltage is lowered correspondingly. This reduces a value of a current that can flow in the MOSFET in an area in which a voltage between the source and the drain of the MOSFET is high. That is, the safe operation area of the MOSFET is narrowed. In this case, the MOSFET has a high risk of being broken by the induced electromotive force from the load.

Accordingly, it is conceivable to lower the breakdown voltage (a clamp voltage) of the clamp circuit. However, an active clamp voltage lower than a voltage such as a load dump surge voltage that may be applied during an output-off time cannot be set.

BRIEF DESCRIPTION OF THE DRAWINGS

FIGS. 3A and 3B show examples of an internal configuration of the delay circuit DL, respectively;

FIG. 4 is a timing chart showing an example of the operation of the semiconductor device 1 according to the present embodiment.

DETAILED DESCRIPTION

Embodiments will now be explained with reference to the accompanying drawings. The present invention is not limited to the embodiments.

A semiconductor device according to an embodiment comprises a first transistor capable of supplying or interrupting power to a load. A clamper comprises a first clamping part and a second clamping part connected in series between one end of the first transistor and a gate of the first transistor and becomes a conduction state when a voltage of the one end of the first transistor exceeds a predetermined voltage. A clamp operation detector is provided between the first clamping part and the second clamping part. A second transistor is connected in parallel with the second clamping part. A delay circuit is provided between the clamp operation detector and a gate of the second transistor.

Figure 1:
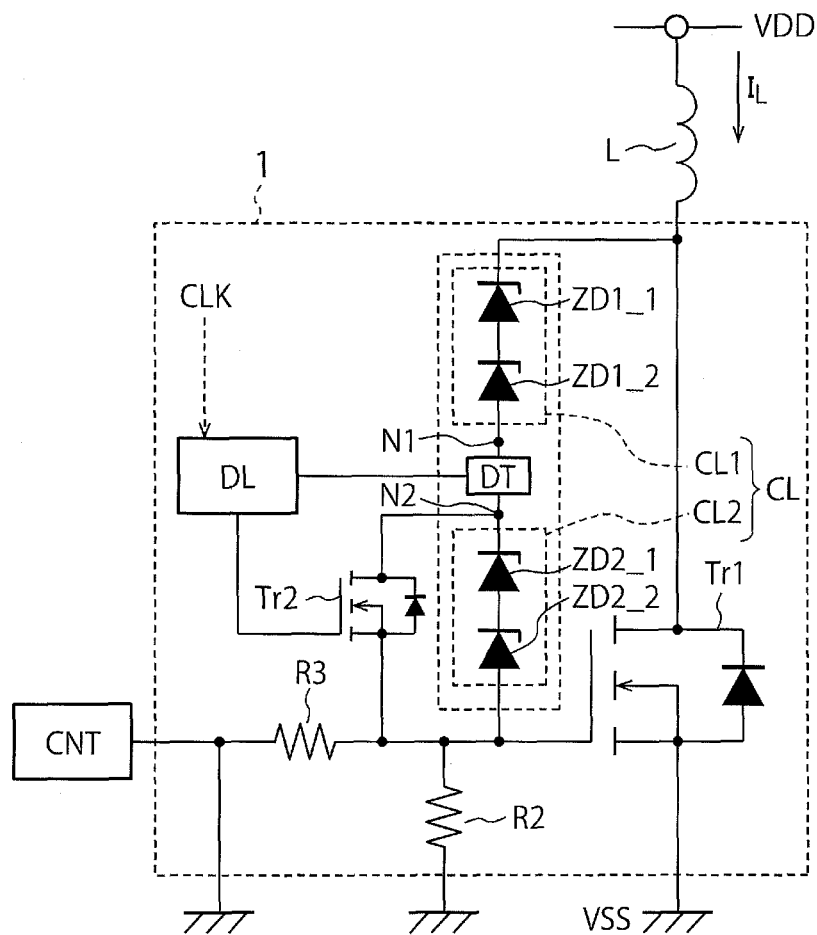
FIG. 1 is a circuit diagram showing an example of a configuration of a semiconductor device 1 according to an embodiment.

FIG. 1 is a circuit diagram showing an example of a configuration of a semiconductor device 1 according to an embodiment. The semiconductor device 1 includes a first transistor Tr1, a second transistor Tr2, a clamper CL, a clamp operation detector DT, a delay circuit DL, and resistors R3 and R2. The semiconductor device 1 can be formed as a single semiconductor chip or can be formed as a single semiconductor package including a plurality of semiconductor chips.

The first transistor Tr1 is a MOSFET connected between a load (an inductor) L and a low-level voltage source VSS. The first transistor Tr1 is, for example, an N-transistor. The first transistor Tr1 and the load L are connected in series between a high-level voltage source VDD and the low-level voltage source VSS. A drain as an end of the first transistor Tr1 is connected to the load L. A source of the first transistor Tr1 is connected to the low-level voltage source VSS. A gate of the first transistor Tr1 is connected to a controller CNT via the resistor R3. Accordingly, the first transistor Tr1 becomes an on-state or an off-state under control of the controller CNT. When the first transistor Tr1 becomes an on-state, the load L is connected to the voltage source VSS and thus a current IL from the voltage source VDD can flow to the voltage source VSS via the load L and the first transistor Tr1. When the first transistor Tr1 becomes an off-state, the load L is disconnected from the voltage source VSS and thus the current IL from the voltage source VDD does not flow through the load L. In this way, the first transistor Tr1 functions as a switch that causes the current IL to flow to the load L or stops the current IL flowing in the load L.

The clamper CL includes a first clamping part CL1 and a second clamping part CL2. The first clamping part CL1 and the second clamping part CL2 are connected in series between the drain of the first transistor Tr1 and the gate thereof.

The first clamping part CL1 is connected between the drain of the first transistor Tr1 and a node N1 and includes two Zener diodes ZD1_1 and ZD1_2. The two Zener diodes ZD1_1 and ZD1_2 are connected in series between the drain of the first transistor Tr1 and the node N1. A cathode of the Zener diode ZD1_1 is connected to the drain of the first transistor Tr1. An anode of the Zener diode ZD1_1 is connected to a cathode of the Zener diode ZD1_2. An anode of the Zener diode ZD1_2 is connected to the node N1. The node N1 is a connection point between the first clamping part CL1 and the second clamping part CL2.

The second clamping part CL2 is connected between a node N2 and the gate of the first transistor Tr1 and includes two Zener diodes ZD2_1 and ZD2_2. The two Zener diodes ZD2_1 and ZD2_2 are connected in series between the node N2 and the gate of the first transistor Tr1. A cathode of the Zener diode ZD2_1 is connected to the node N2. An anode of the Zener diode ZD2_1 is connected to a cathode of the Zener diode ZD2_2. An anode of the Zener diode ZD2_2 is connected to the gate of the first transistor Tr1. In this way, the Zener diodes ZD1_1 to ZD2_2 are connected in such a manner that a direction from the gate of the first transistor Tr1 toward the drain thereof is the forward direction. That is, the Zener diodes ZD1_1 to ZD2_2 included in the first and second clampers CL1 and CL2 are connected between the gate and the drain of the first transistor Tr1 in such a manner that a current direction from the drain to the gate is a reverse direction. With this configuration, when a drain voltage of the first transistor Tr1 exceeds a predetermined voltage (the sum of breakdown voltages of the Zener diodes ZD1_1 to ZD2_2), the clamper CL causes avalanche breakdown and becomes a conduction state. When the clamper CL becomes a conduction state, the clamper CL clamps the drain voltage to the predetermined voltage.

While being constituted of the plural Zener diodes connected in series as described above, each of the first clamping part CL1 and the second clamping part CL2 can be constituted of a single Zener diode. The number of Zener diodes constituting each of the first clamping part CL1 and the second clamping part CL2 can be three or more.

The second transistor Tr2 is connected in parallel with the second clamping part CL2 between the node N2 and the gate of the first transistor Tr1. The second transistor Tr2 is, for example, an N-transistor. A gate of the second transistor Tr2 is connected to the delay circuit DL. The second transistor Tr2 becomes an on-state or an off-state according to a signal from the delay circuit DL. When the second transistor Tr2 is in an off-state, the second clamping part CL2 is in a state being effectively connected between the node N2 and the gate of the first transistor Tr1. That is, the first and second clampers CL1 and CL2 both function effectively. At this time, a clamp voltage of the clamper CL is the sum of the breakdown voltages of the four Zener diodes ZD1_1 to ZD2_2. On the other hand, when the second transistor Tr2 is in an on-state, the second transistor Tr2 short-circuits between the node N2 and the gate of the first transistor Tr1. Therefore, the second clamping part CL2 becomes a disabled state. That is, in this case, while the first clamping part CL1 functions effectively, the second clamping part CL2 is in a state not functioning effectively as a clamp circuit. At this time, a clamp voltage of the clamper CL is the sum of the breakdown voltages of the two Zener diodes ZD1_1 and ZD1_2. In this way, the semiconductor device 1 can enable or disable the clamp function of the second clamping part CL2, thereby changing the clamp voltage of the clamper CL.

The clamp operation detector DT is connected between the node N1 and the node N2. That is, the clamp operation detector DT is connected between the first clamping part CL1 and the second clamping part CL2. The clamp operation detector DT is a circuit that detects a current flowing in the nodes N1 and N2 when the Zener diodes ZD1_1 to ZD2_2 of the clamper CL cause avalanche breakdown. That is, the clamp operation detector DT detects the clamp operation of the clamper CL. Upon detection of the clamp operation of the clamper CL, the clamp operation detector DT starts an operation of the delay circuit DL.

Figure 2:
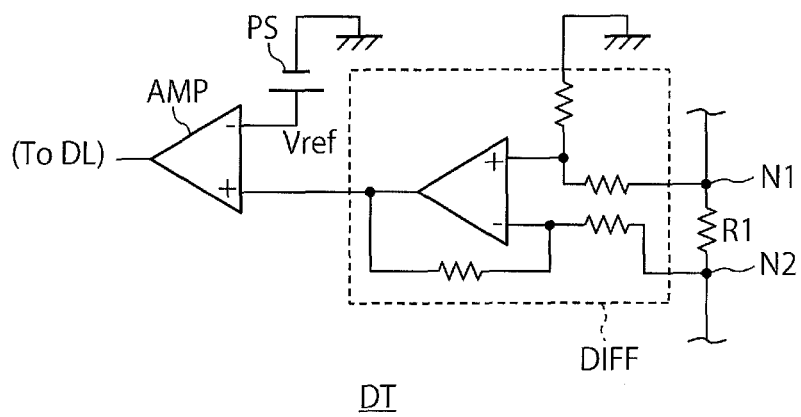
FIG. 2 shows an example of an internal configuration of the clamp operation detector DT.

FIG. 2 shows an example of an internal configuration of the clamp operation detector DT. The clamp operation detector DT includes a first resistive element R1, a differential amplifier DIFF, and an operational amplifier AMP.

The first resistive element R1 is connected between the nodes N1 and N2. That is, the first resistive element R1 is connected between the first clamping part CL1 and the second clamping part CL2. When a current flows in the nodes N1 and N2, a voltage difference occurs between both ends of the first resistive element R1. The clamp operation detector DT detects the start of the clamp operation by detecting the voltage difference between the both ends of the first resistive element R1.

The differential amplifier DIFF serving as a differential part is connected to the nodes N1 and N2 and amplifies the voltage difference between the both ends of the first resistive element R1 to a predetermined voltage to output the predetermined voltage.

The operational amplifier AMP serving as a comparator is connected to an output of the differential amplifier DIFF and a power source PS that generates a reference voltage Vref and outputs a detection signal to the delay circuit DL when an output voltage from the differential amplifier DIFF exceeds the reference voltage Vref.

An output of the operational amplifier AMP is connected to the delay circuit DL. Accordingly, when the voltage difference between the both ends (N1 and N2) of the first resistive element R1 increases and the output voltage from the differential amplifier DIFF exceeds the reference voltage Vref, the operational amplifier AMP outputs the detection signal (the high-level voltage VDD, for example) to the delay circuit DL. The delay circuit DL shown in FIG. 1 brings the second transistor Tr2 into an on-state after a predetermined time has passed from reception of the detection signal from the clamp operation detector DT.

The delay circuit DL is connected between the clamp operation detector DT and the gate of the second transistor Tr2. Upon reception of the detection signal of the clamp operation of the first clamping part CL1 from the clamp operation detector DT, the delay circuit DL brings the second transistor Tr2 into an on-state after elapse of the predetermined time.

FIGS. 3A and 3B show examples of an internal configuration of the delay circuit DL, respectively. The delay circuit DL can be, for example, an RC delay circuit including a resistor and a capacitor as shown in FIG. 3A. Alternatively, the delay circuit DL can be a counter or a shift register that counts a clock signal CLK generated outside or inside the semiconductor device 1 as shown in FIG. 3B. FF in FIG. 3B denotes a flip-flop.

In this way, the semiconductor device 1 according to the present embodiment can change the clamp voltage at the start of the clamp operation and after a predetermined time has passed since the start of the clamp operation. Accordingly, the semiconductor device 1 can operate the first transistor Tr1 within the safe operation area during the clamp operation while keeping the breakdown voltage of the clamper CL relatively high as described later.

Next, an operation of the semiconductor device 1 is explained in more detail.

FIG. 4 is a timing chart showing an example of the operation of the semiconductor device 1 according to the present embodiment. The horizontal axis represents the time. On the vertical axis, VIN indicates a gate voltage applied to the gate of the first transistor Tr1 by the controller CNT. VDS indicates a voltage applied between the source and the drain (hereinafter, also "source-drain voltage") of the first transistor Tr1. IL indicates a current flowing in the load L and the first transistor Tr1.

First, before a time t0, the controller CNT sets the gate voltage VIN at a high-level voltage and thus the first transistor Tr1 is brought into an on-state. Therefore, the first transistor Tr1 can cause a relatively large current IL to flow in the load L and the first transistor Tr1 with a low resistance.

Next, when the controller CNT lowers the gate voltage VIN to a low-level voltage at the time t0, the first transistor Tr1 attempts to become an off-state. However, due to induced electromotive force generated by the load L, a large voltage VDS is applied to the drain of the first transistor Tr1. At this time, when the voltage VDS exceeds the breakdown voltage of the clamper CL (the sum of the breakdown voltages of the Zener diodes ZD1_1 to ZD2_2) as a predetermined voltage, the clamper CL causes avalanche breakdown and increases the gate voltage of the first transistor Tr1. Accordingly, the first transistor Tr1 becomes an on-state and causes an induced current Ipeak to flow from the drain to the source. As a result, breaking of the first transistor Tr1 due to the induced electromotive force can be suppressed.

An operation of thus bringing the first transistor Tr1 into an on-state by the clamper CL that is brought into a conduction state after the controller CNT brings the first transistor Tr1 into an off-state is called "clamp operation". In the clamp operation, the clamper CL clamps the voltage VDS to the predetermined voltage. For example, when the respective breakdown voltages of the Zener diodes ZD1_1 to ZD2_2 are VZ, the breakdown voltage of the clamper CL is 4×VZ. Therefore, when the voltage VDS is about to exceed 4×VZ, the clamper CL clamps the voltage VDS to 4×VZ.

When the clamper CL starts the clamp operation, a current flows in the nodes N1 and N2. Accordingly, a voltage difference occurs between the node N1 and the node N2. That is, a voltage difference occurs between the both ends of the first resistive element R1 of the clamp operation detector DT. This increases the output voltage of the differential amplifier DIFF to approach the reference voltage Vref. When the output voltage of the differential amplifier DIFF exceeds the reference voltage Vref at the time t0, the clamp operation detector DT outputs the detection signal to the delay circuit DL and starts the operation of the delay circuit DL from the time t0. The delay circuit DL applies a predetermined voltage (the high-level voltage VDD, for example) to the gate of the second transistor Tr2 after a delay time Tdelay (t0 to t1) has passed from the time t0. Therefore, the second transistor Tr2 becomes an on-state at the time t1.

When the second transistor Tr2 becomes an on-state at the time t1, the node N2 and the gate of the first transistor Tr1 are short-circuited. Accordingly, a state in which the second clamping part CL2 does not function effectively as a clamp circuit while the first clamping part CL1 is connected effectively between the drain of the first transistor Tr1 and the gate thereof is obtained. As a result, the clamper CL clamps the voltage VDS to 2×VZ in a period from the time t1 to a time t2. That is, while the clamp voltage is 4×VZ between the times t0 and t1, the clamp voltage is lowered to 2×VZ between the times t1 and t2.

When the current IL becomes sufficiently small after a clamp period Tclamp (t0 to t2) has passed, the source-drain voltage VDS of the first transistor Tr1 is sufficiently lowered and the clamper CL becomes a non-conduction state. This brings the first transistor Tr1 into an off-state and the clamp operation ends.

A relation between the operation and the safe operation area of the first transistor Tr1 is explained next.

Figure 5:
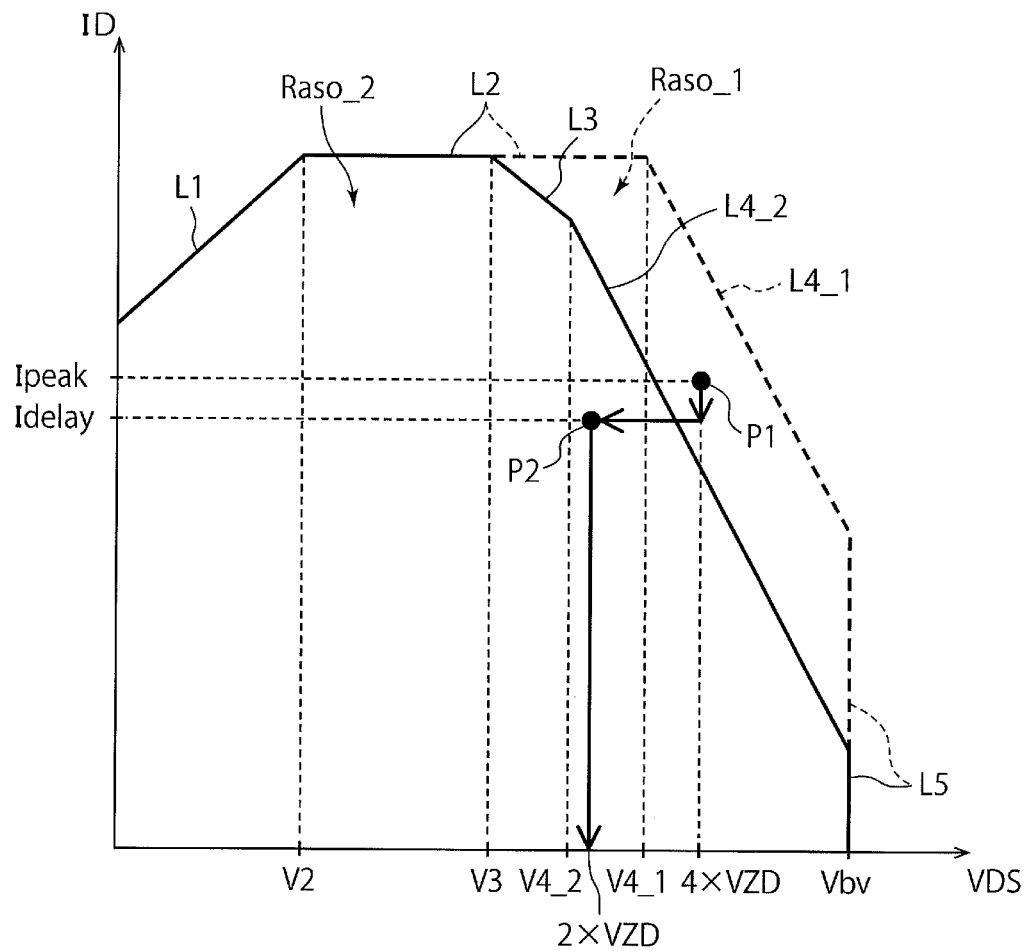
FIG. 5 is a graph showing a safe operation area of the first transistor Tr1 according to the present embodiment.

FIG. 5 is a graph showing a safe operation area of the first transistor Tr1 according to the present embodiment. The horizontal axis represents the source-drain voltage VDS of the first transistor Tr1. The vertical axis represents a drain current ID of the first transistor Tr1. The relation between the operation and the safe operation area of the first transistor Tr1 is explained with reference to FIG. 5. In this example, the drain current ID of the first transistor Tr1 is equal to the load current IL shown in FIG. 4.

Ranges Raso_1 and Raso_2 enclosed by lines L1 to L5 are the safe operation areas of the first transistor Tr1. The safe operation areas Raso_1 and Raso_2 are ranges of the drain current ID and the source-drain voltage VDS in which the first transistor Tr1 can operate without breaking down.

The range Raso_1 indicates a safe operation area immediately after the start of the clamp operation and is an area enclosed by the x axis, the y axis, the lines L1 and L2, the line L4_1 (a broken line), and the line L5. The range Raso_2 indicates a safe operation area after a predetermined time has passed since the start of the clamp operation and is an area enclosed by the x axis, the y axis, and the lines L1, L2, L3, L4_2, and L5.

When the source-drain voltage VDS is 0 to V2, the upper limit of the drain current ID in the safe operation areas Raso_1 and Raso_2 is defined by the line L1. The line L1 indicates a current value defined depending on an on-resistance of the first transistor Tr1. That is, when the source-drain voltage VDS is low, the safe operation area Raso is defined depending on the on-resistance of the first transistor Tr1.

When the source-drain voltage VDS is V2 to V3, the upper limit of the drain current ID in the safe operation areas Raso_1 and Raso_2 is defined by the line L2. The line L2 indicates a current value defined depending on a resistance property of a wire connected to the source or the drain of the first transistor Tr1. If the drain current ID exceeds the line L2, the wire melts and becomes a cause of a malfunction.

When the source-drain voltage VDS is V3 to V4_2, the upper limit of the drain current ID in the safe operation area Raso_2 is defined by the line L3. The line L3 indicates a current value defined depending on a temperature of the semiconductor device 1 (the semiconductor chip) (hereinafter, also "chip temperature"). When the chip temperature exceeds a predetermined temperature (150° C., for example), elements of the semiconductor device 1 may be damaged. Therefore, when the source-drain voltage VDS is V3 to V4_2, the drain current ID is reduced to the line L3 or lower to set the chip temperature at a value lower than the predetermined value.

When the source-drain voltage VDS is V4_1 to Vbv or V4_2 to Vbv, the upper limit of the drain current ID in the safe operation areas Raso_1 and Raso_2 is defined by the line L4_1 or L4_2. The lines L4_1 and L4_2 indicate current values defined depending on a secondary breakdown voltage of the first transistor Tr1. When the drain current ID exceeds the current values indicated by the lines L4_1 and L4_2, the first transistor Tr1 has a high possibility of breakdown.

Vbv indicates a breakdown voltage of the first transistor Tr1. When the source-drain voltage VDS exceeds the breakdown voltage Vbv, the first transistor Tr1 is expected to break down. Therefore, regardless of the drain current ID, the source-drain voltage VDS is set at a value equal to or lower than the breakdown voltage Vbv.

While low at the initial time of the start of the clamp operation, the chip temperature increases after the start of the clamp operation as the time proceeds. Increase in the chip temperature lowers the secondary breakdown voltage of the first transistor Tr1. Accordingly, the safe operation area is relatively wide immediately after the start of the clamp operation as shown by Raso_1 and is narrowed as the time proceeds as shown by Raso_2.

As described above, the safe operation area Raso_1 is gradually narrowed after the start of the clamp operation as the time proceeds to approach the safe operation area Raso_2. Therefore, to suppress breakdown of the first transistor Tr1 in the clamp operation, it is conceivable that the source-drain voltage VDS is lowered after a predetermined time has passed since the start of the clamp operation.

The semiconductor device 1 according to the present embodiment thus lowers the clamp voltage after a predetermined time has passed since the start of the clamp operation. That is, the clamp voltage is kept high at the start of the clamp operation. On the other hand, after the predetermined time (the delay time Tdelay) has passed since the start of the clamp operation, the clamp voltage is lowered.

For example, when the respective breakdown voltages of the Zener diodes ZD1_1 to ZD2_2 are VZ as described above, the clamp voltage at the time of the start of the clamp operation is 4×VZ. That is, the breakdown voltage of the clamper CL is the sum (4×VZ, for example) of the breakdown voltages of both the first and second clampers CL1 and CL2. At this time, the safe operation area is the area Raso_1 and is relatively wide. Therefore, the first transistor Tr1 is within the range of the safe operation area Raso_1 as indicated by a point P1 in FIG. 5.

The second transistor Tr2 becomes an on-state after the delay time Tdelay shown in FIG. 4 has passed since the start of the clamp operation. Accordingly, the clamp voltage lowers to the breakdown voltage (2×VZ, for example) of the first clamping part CL1. At this time, the safe operation area changes from the area Raso_1 to the area Raso_2. As shown in FIG. 5, the clamp voltage lowers from 4×VZ to 2×VZ and the drain current ID lowers from the current Ipeak to a current Idelay. Accordingly, the first transistor Tr1 is within the safe operation area Raso_2 as indicated by a point P2 in FIG. 5.

As described above, according to the present embodiment, the clamp voltage is the sum (4×VZ, for example) of the breakdown voltages of both the first and second clampers CL1 and CL2 before the start of the clamp operation and before the predetermined time (t2 in FIG. 4) has passed since the start of the clamp operation. The clamp voltage then lowers to the breakdown voltage (2×VZ, for example) of the first clamping part CL1 after a predetermined time (the delay time Tdelay) has passed. That is, the semiconductor device 1 according to the present embodiment can change the clamp voltage in plural stages during the clamp operation. Accordingly, while the breakdown voltage of the clamper CL before the start of the clamp operation is kept high, the first transistor Tr1 can be operated within the safe operation area (Raso_1 and Raso_2) after the start of the clamp operation.

Because the breakdown voltage of the clamper CL before the start of the clamp operation can be kept high, a voltage that can be applied when the first transistor Tr1 is in an off-state (a load dump surge voltage or the power supply voltage VDD, for example) can be set high. On the other hand, after the predetermined time has passed from the start of the clamp operation, the clamp voltage can be lowered to operate the first transistor Tr1 within the safe operation area.

The safe operation area varies according to the size (gate width/gate length) of the first transistor Tr1, the type of the first transistor Tr1, or the package thereof. Accordingly, the breakdown voltage VZ of the Zener diode in the clamper CL, the delay time Tdelay in the delay circuit DL, and the like need to be set for each product.

When the size of the first transistor Tr1 is large, the safe operation area is relatively wide. However, if the first transistor Tr1 is downscaled, the secondary breakdown voltage is lowered. The safe operation area is thus narrowed due to downscaling of the first transistor Tr1. If the clamp voltage is constant in the downscaled first transistor Tr1, the clamp voltage of the clamper CL needs to be set at a low value in advance assuming that the safe operation area is further narrowed with increase in the chip temperature after the start of the clamp operation. In this case, the breakdown voltage of the clamper CL before the start of the clamp operation cannot be kept high.

On the other hand, according to the present embodiment, the breakdown voltage of the clamper CL before the start of the clamp operation can be kept high and also the clamp voltage can be lowered after the predetermined time has passed from the start of the clamp operation, thereby operating the first transistor Tr1 within the safe operation area.

Therefore, even when the first transistor Tr1 is downscaled, the semiconductor device 1 according to the present embodiment can operate the first transistor Tr1 within the safe operation area. That is, even when the size of the first transistor Tr1 is reduced, the present embodiment can change the breakdown voltage of the clamper CL during the clamp operation, thereby enabling the first transistor Tr1 to operate within the safe operation area while keeping the breakdown voltage of the clamper CL high.

In the embodiment described above, the clamper CL has the first and second clampers CL1 and CL2 and changes the clamp voltage in two stages. However, the clamper CL can change the clamp voltage in three or more stages. In this case, it suffices to provide a plurality of the delay circuits, the second transistors, and the clamp operation detectors, respectively.

In the embodiment described above, the second transistor Tr2 is connected between the node N2 and the gate of the first transistor Tr1. However, the second transistor Tr2 can be connected between the node N1 and the gate of the first transistor Tr1.

Furthermore, in the embodiment described above, the second transistor Tr2 is an N-transistor. However, the second transistor Tr2 can be a P-transistor. In this case, it suffices to configure the clamp operation detector DT to output a low-level voltage to bring the second transistor Tr2 into an on-state when the voltage difference between the nodes N1 and N2 increases and the output voltage of the differential amplifier DIFF exceeds the reference voltage Vref.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
   a first transistor capable of supplying or interrupting power to a load;
   a clamper comprising a first clamping part and a second clamping part connected in series between one end of the first transistor and a gate of the first transistor, the clamper becoming a conduction state when a voltage of the one end of the first transistor exceeds a predetermined voltage;
   a clamp operation detector provided between the first clamping part and the second clamping part;
   a second transistor connected in parallel with the second clamping part; and
   a delay circuit provided between the clamp operation detector and a gate of the second transistor.

2. The device of claim 1, wherein the first and second clamping parts respectively comprise a single Zener diode or a plurality of Zener diodes connected in series.

3. The device of claim 2, wherein the single or plural Zener diodes included in the first and second clamping parts are connected between the one end of the first transistor and the gate thereof in such a manner that a current direction from the gate to the one end is a forward direction.

4. The device of claim 1, wherein the delay circuit is an RC delay circuit.

5. The device of claim 2, wherein the delay circuit is an RC delay circuit.

6. The device of claim 3, wherein the delay circuit is an RC delay circuit.

7. The device of claim 1, wherein the delay circuit is a counter-counting a clock signal.

8. The device of claim 2, wherein the delay circuit is a counter-counting a clock signal.

9. The device of claim 3, wherein the delay circuit is a counter-counting a clock signal.

10. The device of claim 1, wherein
the delay circuit applies a predetermined voltage to the gate of the second transistor after a predetermined time has passed from a time point when a detection signal indicating that the clamper becomes a conduction state is received from the clamp operation detector, and
the second transistor becomes an on-state upon reception of the predetermined voltage from the delay circuit.

11. The device of claim 2, wherein
the delay circuit applies a predetermined voltage to the gate of the second transistor after a predetermined time has passed from a time point when a detection signal indicating that the clamper becomes a conduction state is received from the clamp operation detector, and
the second transistor becomes an on-state upon reception of the predetermined voltage from the delay circuit.

12. The device of claim 3, wherein
the delay circuit applies a predetermined voltage to the gate of the second transistor after a predetermined time has passed from a time point when a detection signal indicating that the clamper becomes a conduction state is received from the clamp operation detector, and
the second transistor becomes an on-state upon reception of the predetermined voltage from the delay circuit.

13. The device of claim 1, wherein the clamp operation detector comprises a first resistive element connected between the first clamping part and the second clamping part, a differential part converting a voltage difference between both ends of the first resistive element to a predetermined voltage and outputting the predetermined voltage, and a comparator outputting a detection signal to the delay circuit when an output voltage from the differential part exceeds a reference voltage.

14. The device of claim 2, wherein the clamp operation detector comprises a first resistive element connected between the first clamping part and the second clamping part, a differential part converting a voltage difference between both ends of the first resistive element to a predetermined voltage and outputting the predetermined voltage, and a comparator outputting a detection signal to the delay circuit when an output voltage from the differential part exceeds a reference voltage.

15. The device of claim 3, wherein the clamp operation detector comprises a first resistive element connected between the first clamping part and the second clamping part, a differential part converting a voltage difference between both ends of the first resistive element to a predetermined voltage and outputting the predetermined voltage, and a comparator outputting a detection signal to the delay circuit when an output voltage from the differential part exceeds a reference voltage.

16. The device of claim 10, wherein the clamp operation detector comprises a first resistive element connected between the first clamping part and the second clamping part, a differential part converting a voltage difference between both ends of the first resistive element to a predetermined voltage and outputting the predetermined voltage, and a comparator outputting a detection signal to the delay circuit when an output voltage from the differential part exceeds a reference voltage.

17. The device of claim 1, wherein the semiconductor device is a single semiconductor package.

\* \* \* \* \*